(12) United States Patent
Moon et al.

(10) Patent No.: US 8,524,571 B2
(45) Date of Patent: Sep. 3, 2013

(54) VACUUM WAFER LEVEL PACKAGING METHOD FOR MICRO ELECTRO MECHANICAL SYSTEM DEVICE

(75) Inventors: Jong Tae Moon, Daejeon (KR); Yong Sung Eom, Daejeon (KR); Hyun-Cheol Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 100 days.

(21) Appl. No.: 13/309,582

(22) Filed: Dec. 2, 2011

(65) Prior Publication Data
US 2012/0164787 A1 Jun. 28, 2012

(30) Foreign Application Priority Data
Dec. 23, 2010 (KR) ........................ 10-2010-0133515

(51) Int. Cl.
*H01L 21/30* (2006.01)
*H01L 21/46* (2006.01)
*H01L 41/00* (2013.01)

(52) U.S. Cl.
USPC .......................................... 438/456; 310/324

(58) Field of Classification Search
USPC .................... 438/456; 310/324; 257/419
See application file for complete search history.

(56) References Cited

U.S. PATENT DOCUMENTS

| 6,808,954 | B2 |  | 10/2004 | Ma et al. |
| 7,008,817 | B2 | * | 3/2006 | Kim et al. .................. 438/106 |
| 7,696,064 | B2 | * | 4/2010 | Gan et al. .................. 438/456 |
| 8,084,866 | B2 | * | 12/2011 | Hiatt et al. .................. 257/774 |
| 8,309,433 | B2 | * | 11/2012 | Matsuki et al. ............... 438/458 |
| 8,329,555 | B2 | * | 12/2012 | Reichenbach et al. ........ 438/456 |
| 2005/0189621 | A1 |  | 9/2005 | Cheung |
| 2006/0043601 | A1 | * | 3/2006 | Pahl .............................. 257/777 |

FOREIGN PATENT DOCUMENTS
KR 2010-0092914 A 8/2010

OTHER PUBLICATIONS

Rob N. Candler et al., "Single Wafer Encapsulation of MEMS Devices", IEEE Transactions on Advanced Packaging, vol. 26, No. 3, pp. 227-232, Aug. 2003.

* cited by examiner

*Primary Examiner* — William D Coleman
(74) *Attorney, Agent, or Firm* — Rabin & Berdo, P.C.

(57) ABSTRACT

Disclosed is a vacuum wafer level packaging method for a micro electro mechanical system device, including: forming a plurality of via holes on an upper wafer for protecting a micro electro mechanical system (MEMS) wafer; forming at least one metal layer on inner walls of the plurality of via holes and regions extended from the plurality of via holes; arranging and bonding the upper wafer and the MEMS wafer at atmospheric pressure; applying solder paste to the regions extended from the plurality of via holes; filling a solder in the plurality of via holes by increasing the temperature of a high-vacuum chamber to melt the solder paste; and changing the solder in the plurality of via holes to a solid state by lowering the temperature of the high-vacuum chamber.

8 Claims, 2 Drawing Sheets

VACUUM WAFER LEVEL PACKAGING METHOD FOR MICRO ELECTRO MECHANICAL SYSTEM DEVICE

CROSS-REFERENCE TO RELATED APPLICATIONS

This application is based on and claims priority from Korean Patent Application No. 10-2010-0133515, filed on Dec. 23, 2010, with the Korean Intellectual Property Office, the present disclosure of which is incorporated herein in its entirety by reference.

TECHNICAL FIELD

The present disclosure relates to a micro electro mechanical system device, and more particularly, to a vacuum wafer level packaging method for a micro electro mechanical system device capable of simply forming vacuum in a bonded inner area at the time of bonding the inner area of the micro electro mechanical system device at a wafer level in order to maintain vacuum in the micro electro mechanical system device.

BACKGROUND

A micro electro mechanical system (hereinafter, referred to as 'MEMS') device represents a micro device manufactured by applying a semiconductor manufacturing process. Since the MEMS device sensitively reacts even to contamination by minute dust or a surrounding minute electrical signal due to the micro size thereof, an appropriate countermeasure is required to prevent the MEMS device from being influenced by contamination and surrounding environments. In order to meet the requirement, a manufacturing process of the MEMS device includes bonding a cover made of a material such as glass to the top of a substrate where an MEMS structure is formed. In addition, a vacuum state is required between the cover and the substrate for stable operation of the MEMS device according to a characteristic of the MEMS device.

As described above, in order to vacuum-mount the MEMS device, a vacuum mounting method using anodic bonding and a vacuum mounting method using a getter material have been primarily used in the related art. In the anodic bonding as a technique of bonding two heterogeneous materials such as a glass plate and a silicon substrate to each other by using high temperature and high voltage, the silicon substrate and the glass plate with a cavity are arranged in a chamber and glass ions are moved to silicon by heating the glass plate at the high temperature and applying the high-temperature voltage to the glass plate while controlling a vacuum level in the chamber by using inert gas to thereby bond two different materials. As a result, the cavity has the vacuum state by bonding the two materials.

In the vacuum mounting method using the getter material, the glass plate with the cavity and the silicon substrate are bonded to each other with a part of the cavity attached with the getter material for increasing the vacuum level or purity of filling gas so as to keep the cavity in the vacuum state.

However, in the related art, as individual MEMS devices are manually vacuum packaged in order to keep a wide area including an area other than the MEMS device in the vacuum state. Therefore, a lot of relevant components are required and the size of the entire product is also larger than that of the MEMS device, but the size of the MEMS device is limited even in a system adopting the MEMS device.

SUMMARY

The present disclosure has been made in an effort to provide a vacuum wafer level packaging method for a micro electro mechanical system device capable of shortening a vacuum wafer level packaging process in the related art which is complicated and low in yield.

An exemplary embodiment of the present disclosure provides a vacuum wafer level packaging method for a micro electro mechanical system device, including: forming a plurality of via holes on an upper wafer for protecting a micro electro mechanical system (MEMS) wafer; forming at least one metal layer on inner walls of the plurality of via holes and regions extended from the plurality of via holes; arranging and bonding the upper wafer and the MEMS wafer at atmospheric pressure; applying solder paste to the regions extended from the plurality of via holes; filling a solder in the plurality of via holes by increasing the temperature of a high-vacuum chamber to melt the solder paste; and changing the solder in the plurality of via holes to a solid state by lowering the temperature of the high-vacuum chamber.

According to the exemplary embodiments of the present disclosure, by providing a vacuum wafer level packaging method of a micro electro mechanical system device in which a via hole is formed in an upper wafer and thereafter, a liquid solder is arbitrarily moved into the via hole by using wetting force to fill the via hole, a process of vacuum packaging up to a surrounding area in order to keep a vacuum level for each of individual MEMS devices in the related art, can be shortened and a product price can be remarkably reduced.

Since the vacuum wafer level packaging method of the micro electro mechanical system device can be applied to various MEMS devices, electronic devices, and image sensors, the method can have a wide use range thereof.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

FIGS. 1 to 6 are process flowcharts for describing a vacuum wafer level packaging method of a micro electro mechanical system device according to an exemplary embodiment of the present disclosure.

Figure 1:
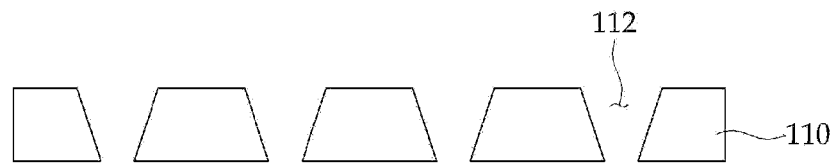
FIGS. 1 to 6 are process flowcharts for describing a vacuum wafer level packaging method of a micro electro mechanical system device according to an exemplary embodiment of the present disclosure.

Referring to FIG. 1, a plurality of via holes 112 are formed on an upper wafer 110 by using methods including deep reactive ion etching (DRIE), chemical etching, laser etching, and physical etching.

Figure 2:
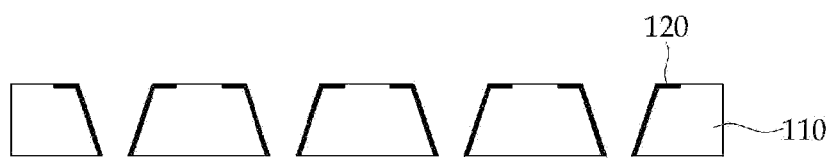

Referring to FIG. 2, a metal layer 120 is formed on inner walls of plural via holes 112 and regions extended from plural via holes 112 through an ion beam sputtering process using a sputtering apparatus, an ion beam apparatus, and a heat deposition apparatus. Herein, metal layer 120 may be formed by two or three metal layers such as Ti/Ni/Au or Ti/Ni/Cu so as to stably react to solder paste to be described below.

Figure 3:
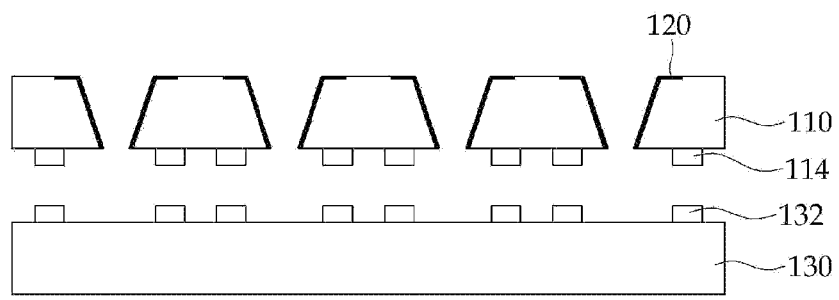

Referring to FIG. 3, a plurality of metallic patterns 114 and 132 which are symmetric to each other, are formed on the bottom of upper wafer 110 and the top of an MEMS wafer 130, respectively. Herein, plural metallic patterns 114 formed on upper wafer 110 and plural metallic patterns 132 formed on MEMS wafer 130 are used as a region where upper wafer 110 and MEMS wafer 130 are bonded to each other.

Figure 4:
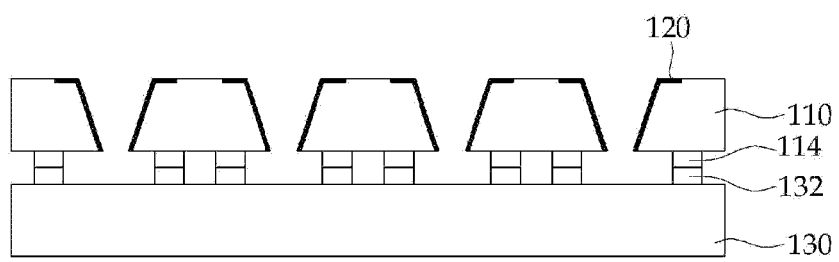

Referring to FIG. 4, at atmospheric pressure, plural metallic patterns 114 formed on upper wafer 110 and plural metallic patterns 132 formed on MEMS wafer 130 are arranged and upper wafer 110 and MEMS wafer 130 are bonded to each other by using solder. In this case, heating temperature and pressure are determined depending on a melting temperature and a bonding area of the used solder.

Figure 5:
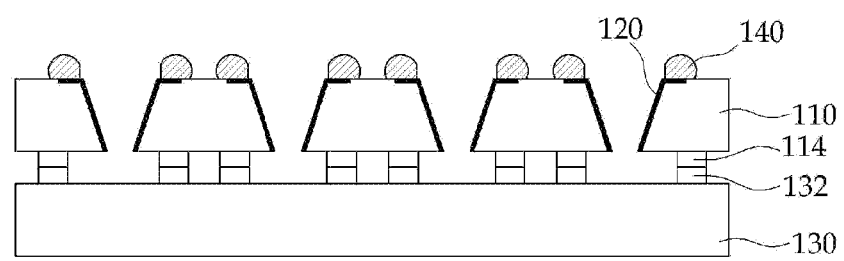

Referring to FIG. 5, solder paste 140 is applied to the regions extended from plural via holes 112 of upper wafer 110 through a screen printing process or an inkjet printing process.

Figure 6:
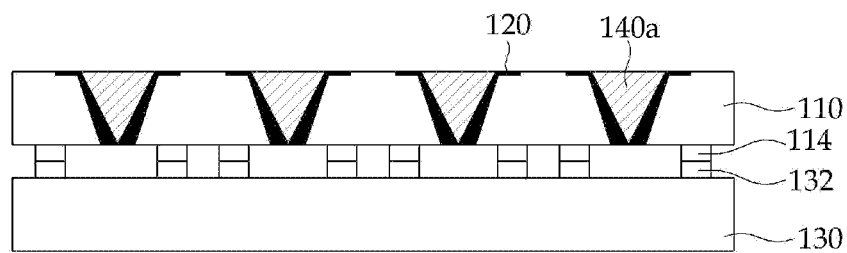

Referring to FIG. 6, when upper wafer 110 and MEMS wafer 130 bonded to each other at the atmospheric pressure are injected into a high-vacuum chamber, upper wafer 110 is perforated by plural via holes 112, and as a result, an internal vacuum level and an external vacuum level of upper wafer 110 and MEMS wafer 130 bonded to each other are the same as each other after a predetermined time elapses. In this case, the solder paste 140 is melted by increasing temperature in the high-vacuum chamber to fill a solder 140a in plural via holes 112, thus solder 140a is charged in plural via hole 112 because a liquid solder is moved into plural via holes 112 along a metal layer extended from plural via holes 112 by wetting force.

Thereafter, when filling of solder 140a in plural via holes 112 is completed, solder 140a is solidified to a solid state by lowering the temperature of the high-vacuum chamber, such that the solid-state solder may be naturally filled in plural via holes 112. Accordingly, inner parts of upper wafer 110 and MEMS wafer 130 bonded to each other may maintain the high-vacuum state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A vacuum wafer level packaging method for a micro electro mechanical system device, comprising:
    forming a plurality of via holes on an upper wafer for protecting a micro electro mechanical system (MEMS) wafer;
    forming at least one metal layer on inner walls of the plurality of via holes and regions extended from the plurality of via holes;
    arranging and bonding the upper wafer and the MEMS wafer at atmospheric pressure;
    applying solder paste to the regions extended from the plurality of via holes;
    filling a solder in the plurality of via holes by increasing the temperature of a high-vacuum chamber to melt the solder paste; and
    changing the solder in the plurality of via holes to a solid state by lowering the temperature of the high-vacuum chamber.

2. The method of claim 1, wherein in the forming of the via hole, the plurality of via holes are formed through at least one process of deep reactive ion etching (DRIE), chemical etching, laser etching, and physical etching.

3. The method of claim 1, in the forming of the metal layer, the plurality of metal layers are formed through an ion beam sputtering process.

4. The method of claim 1, wherein the plurality of metal layers are formed by at least two metal layers including Ti, Ni, Au, and Cu.

5. The method of claim 1, wherein the bonding of the wafers includes:
    forming a plurality of metallic patterns which are symmetric to each other on the bottom of the upper wafer and the top of the MEMS wafer, respectively; and
    arranging the plurality of metallic patterns formed on the upper wafer and the plurality of metallic patterns formed on the MEMS wafer and bonding the upper wafer and the MEMS wafer to each other by using the solder.

6. The method of claim 1, wherein in the applying of the solder paste, the solder paste is applied through a screen printing process or an inkjet printing process.

7. The method of claim 1, wherein in the filling of the solder, a liquid solder is moved into the plurality of via holes along a metal layer extended from the plurality of via holes by wetting force.

8. The method of claim 5, wherein in the bonding of the upper wafer and the MEMS wafer to each other, heating temperature and pressure are determined according to a melting temperature and a bonding area of the solder.

* * * * *